United States Patent
Wehrhan et al.

(10) Patent No.: US 6,969,502 B2
(45) Date of Patent: Nov. 29, 2005

(54) METHOD AND DEVICE FOR GROWING LARGE-VOLUME ORIENTED MONOCRYSTALS

(75) Inventors: Gunther Wehrhan, Jena (DE); Peter Elzner, Lorch (DE); Ewald Moersen, Mainz (DE); Richard Schatter, Eppsteinl Sreluthal (DE); Hans-Joerg Axmann, Jena (DE); Thorsten Reichardt, Stadtroda (DE)

(73) Assignee: Schott Glas, Mainz (DE)

( * ) Notice: Subject to any disclaimer, the term of this patent is extended or adjusted under 35 U.S.C. 154(b) by 78 days.

(21) Appl. No.: 10/220,115

(22) PCT Filed: Mar. 2, 2001

(86) PCT No.: PCT/DE01/00790

§ 371 (c)(1),
(2), (4) Date: Oct. 23, 2002

(87) PCT Pub. No.: WO01/64975

PCT Pub. Date: Sep. 7, 2001

(65) Prior Publication Data

US 2003/0089307 A1 May 15, 2003

(30) Foreign Application Priority Data

Mar. 3, 2000 (DE) .......................................... 100 10 484

(51) Int. Cl.$^7$ ............................. C01B 9/00; C30B 13/16
(52) U.S. Cl. ........................ 423/328.2; 117/81; 117/83; 117/200; 117/900
(58) Field of Search .............................. 117/81, 83, 200, 117/900; 423/328.2

(56) References Cited

U.S. PATENT DOCUMENTS

| | | |
|---|---|---|
| 4,086,424 A | 4/1978 | Mellen, Sr. |
| 5,372,088 A | 12/1994 | Shahid |
| 2003/0178634 A1 | 9/2003 | Koide |

FOREIGN PATENT DOCUMENTS

| | | |
|---|---|---|
| DE | 33 23 896 A | 1/1985 |
| DE | 199 12 484 A | 9/2000 |
| EP | 0 338 411 A | 10/1989 |
| EP | 0 919 646 B1 | 3/2002 |
| EP | 0 939 147 B1 | 9/2003 |

OTHER PUBLICATIONS

Althaus M., et al: "Some New Design Features for Vertical Bridgman Furnices . . . ", Journal of Crystal Growth, NL, North–Holland Publishing Co., Amsterdam, BD. 166, NR. 1, Sep. 1, 1996, pp. 566–571.
Patent Abstracts of Japan vol. 1999, No. 08, Jun. 30, 1999 & JP 11 079880 A, Mar. 23, 1999.
Patent Abstracts of Japan vol. 1998, No. 09, Jul. 31, 1998 & JP 10 101484 A, Apr. 21, 1998.
Sabharwal: "A Technique for Growth of Alkali Halide Crystal in Stationary Crucible", Journal of Crystal Growth., BD. 80, NR. 1, Jan. 1987, pp. 33–36.
Horpwitz: "The Growth of Single Crystals of Optical Materials Via . . . ", Journal of Crystal Growth., BD. 85, NR. 1–2, Nov. 1, 1987, pp. 215–222.

*Primary Examiner*—Felisa Hiteshew
(74) *Attorney, Agent, or Firm*—Michael J. Striker

(57) ABSTRACT

In the method for growing large-volume monocrystals crystal raw material is heated in a melting vessel with heating elements to a temperature above its melting point until a melt is formed. A monocrystal is then formed on the bottom of the melting vessel by lowering the temperature at least to the crystallization point. A solid/liquid phase boundary is formed between the monocrystal and the melt. The monocrystal grows towards the melt surface in a direction that is perpendicular to the phase boundary. A vertical axial temperature gradient is produced and maintained between the bottom of the melting vessel and its upper opening and heat inflow and/or heat outflow through side walls of the melting vessel is prevented, so that the solid/liquid phase boundary has a curvature radius of at least one meter. A crystal-growing device for performing this process is also described.

27 Claims, 3 Drawing Sheets

METHOD AND DEVICE FOR GROWING LARGE-VOLUME ORIENTED MONOCRYSTALS

BACKGROUND OF THE INVENTION

The invention relates to a method for growing large-volume monocrystals of uniform orientation from a melt, to a device for carrying out this method and to the use of crystals prepared in this manner.

Monocrystals are characterized by the fact that they have a uniform orientation throughout their entire volume which is a prerequisite for high optical homogeneity within the entire crystal volume. For this reason, they are eminently suited for use in the optical industry or as starting material for optical components in deep-ultraviolet [DUV] photolithography, for example for steppers or excimer lasers.

The growing of monocrystals from a melt is in itself known. Text books about crystal growing, for example "Kristallzüjchtung" [The Growing of Crystals] by K. Th. Wilke and J. Bohm, which has 1088 pages, describe a wide variety of different methods for crystal growing of which the most common techniques will be mentioned briefly in the following. In principle, crystals can be grown from the gas phase, from the melt, from solutions or even from a solid phase by recrystallization or diffusion through a solid body. Such methods, however, are meant primarily for laboratory-scale work and not for large-scale industrial production. The most important large-scale melt growing processes for making crystals will be explained briefly in the following.

The Czochralski method involves dipping, with the aid of a finger-type tool, a slightly cooled seed crystal into a crucible containing molten crystal raw material and then pulling this seed crystal out slowly, preferably with rotation. In this manner, during the pulling, the seed crystal grows into a larger crystal.

The drawback of this method is that cooling produces relatively large temperature changes in the crystal resulting in stress-induced anisotropy.

By the vertical Bridgeman method, a crystal raw material is melted in a mobile melting crucible by means of a heating jacket. The crucible is then slowly lowered from the heating jacket through an axial temperature gradient produced by heaters. Or, alternatively, the crucible is stationary, and a mobile heating system is moved upward. The melt is thus cooled allowing the slow growth of an added seed crystal. In a variant of this method known as the Bridgeman-Stockbager method, a crystal is formed by slowly lowering the mobile crucible in an axial gradient between two heating jackets disposed above each other and between which exists a major temperature difference.

In the vertical gradient freeze method (VGF method), several concentric heating coils are disposed over each other around the stationary melting crucible so as to form a jacket. Each of these coils can be controlled separately. By slowly decreasing the heat output of each individual heating coil disposed around the crucible wall, the temperature is slowly reduced to below the crystallization point thus generating a radial temperature gradient along which crystal growth takes place.

In the gradient solidification method (GSM), a ring-shaped heating coil surrounding a stationary melting crucible is slowly moved downward and then upward.

Nevertheless, oriented monocrystals usually do not exhibit homogeneous optical and mechanical properties. It is desirable that such crystals be produced with a crystal orientation appropriate for a particular application. This, however, creates major problems in the production of large monocrystals, because during their growth such crystals spontaneously change their orientation, namely the position of their crystal axis. This leads to optically nonuniform crystals which do not exhibit the same light refraction in all regions.

Until now, while it was possible to produce crystals exhibiting some of these properties, it was not possible to grow large-volume uniformly oriented crystals that are free of convergences, are optically highly homogenous, exhibit high transmission and, in addition, do not discolor when exposed to a strong radiation source.

Attempts have been made by hitherto known methods, for example in the production of large calcium fluoride monocrystals, to grow the crystal in the direction of the {111} axis. This gave very low yields, however, namely only about 6–8% of the growing attempts gave a satisfactory crystal size. Because such crystal growing methods involve a process with a running time of approximately 6 weeks, and the number of such growing units is limited because of cost reasons, only low yields were achieved. Moreover, it was not possible by use of previously employed methods to produce large-volume monocrystals, particularly monocrystals extending far in all three directions in space, namely preferably round crystals with a diameter of >200 mm and a height of >100 mm, because such dimensions regularly lead to block formation within the crystal volume, namely a reorientation of the crystal axes takes place. Moreover, it has thus far not been possible to obtain satisfactorily such large crystals also in optically highly homogeneous form, namely so that their light refraction is the same in all regions. Another problem with such crystals is their radiation resistance, namely their ability not to undergo discoloration when exposed to a strong radiation source, for example a laser. This problem causes a decrease in yield, for example in the large-scale production of wafers.

It has already been attempted to produce large monocrystals by growing them in the shape of plates. EP-A-0 338 411, for example, describes an apparatus and a method for the controlled growing of large monocrystals in plate shape from a melt and by use of a melting crucible which has a rectangular cross-section and is configured so as to present two relatively wide and two relatively narrow side walls with heating devices disposed immediately adjacent to the wide sides. In this case, after the melting, the crucible is slowly lowered from the heating jacket by means of a lifting device as a result of which the crucible contents cool and crystallize. Although by this method it is possible to produce large oriented monocrystal plates, said plates do not adequately extend in all three directions in space.

SUMMARY OF THE INVENTION

Hence, the object of the invention is to produce large-volume crystals which are grown in any selected orientation along their {h,k,l} axes, preferably in the {111} or {112} orientation.

Another object of the invention is to produce large-volume crystals which extend far in all three directions in space.

According to the invention, this objective is reached by means of the method and device defined in the claims.

Surprisingly, we have now found that large-volume crystals can be produced by allowing them to cool with the aid of an axially disposed temperature gradient, namely a temperature gradient that is parallel to the growing direction, or with the aid of an axial heat flow while avoiding a radial, lateral heat flow perpendicular to it. In this manner, a nearly planar boundary is formed between the solid crystalline and the molten liquid phase. In contrast to this method, by the growing methods of the prior art, a lateral radial heat flow is predominantly formed, either as the only heat supply or heat removal or in combination with the heating elements disposed above and below a melting crucible.

The device according to the invention for growing large-volume monocrystals comprises a closable housing, a melting vessel contained therein and at least one heating element with a heat output sufficient to melt the crystal raw material present in the melting vessel and/or to keep the already molten crystal raw material in the molten state.

The melting vessel is preferably round. In special cases, however, a melting vessel with an oval or quadrangular cross-section may also be advantageous. The melting vessel comprises an internal receiving space or melting space formed by the bottom of the melting vessel, the side walls and an upper opening opposite the bottom.

In a particular embodiment of the invention, the upper opening opposite the bottom is closed by means of a cover. Said cover is preferably configured so that it does not rest on the side walls in gas-tight fashion, but so that the volatile impurities formed upon melting can leave the melting or crystal space. Laterally, around the melting crucible, there is disposed at least one element and preferably several elements which prevent a radial lateral heat flow. Preferably, the lateral elements are heat insulators, particularly those made of heat-insulating material. In a particular embodiment, the device according to the invention has a supporting heating system disposed laterally at a distance from the melting crucible, which is intended to prevent lateral heat flow. Advantageously, this supporting heating system is disposed at a distance from the melting vessel that is sufficient to prevent the generated heat from exerting any direct influence on the processes taking place in the melt. The supporting heating system only serves to equalize any temperature gradients arising between the melting crucible and the heat flow-preventing elements that surround said crucible, and the surroundings. Said supporting heating system is therefore usually separated from the walls of the melting crucible by an interposed layer of heat-insulating elements. Preferably, the supporting heating system is configured as a heating jacket.

The bottom of the melting vessel can be configured as desired. Usually, however, it is sloped downward in conical fashion. It thus forms a pyramid or preferably a cone, a truncated pyramid or cone being particularly preferred.

The bottom of the crucible is preferably provided with a downward protruding well which serves to receive a seed crystal of-a desired orientation. The seed crystal well is preferably disposed in the middle of the bottom, namely at the tip of the cone or pyramid. In a preferred embodiment of the invention, the seed crystal well has, particularly at its lower end, a cooling element. This cooling element is preferably a water-filled cooling element which during the melting of the crystal raw material protects the seed crystal present in the well from premature incipient or complete melting. In a preferred embodiment of the invention, the cooling element is heatable.

In a preferred embodiment of the invention, the melting crucible is provided above the melting space with a widened buffer space which serves as a funnel for charging the crystal raw material. In particular, however, it serves to equilibrate the heat given off by a cover heater to ensure that the heat flow produced will act uniformly on the crystal mass and that any local temperature differences arising at the heater will be corrected. Preferably, the actual melting space is provided with a heat-conducting cover separating the insulation space from the actual melting space. Said cover also serves to equilibrate the temperature and consists of an only slightly heat-insulating material.

The device according to the invention is provided with at least one heating element disposed above the melting vessel. Thanks to the insulation element enveloping the melting vessel and preventing a lateral heat flow, the heating of this heating element that is disposed above the melting vessel produces a heat flow which in the melting vessel runs exclusively axially. A lateral heat flow is prevented by the insulation elements. Advantageously, this upper heating element is a cover heater.

It has been found advantageous to provide a bottom heater at the bottom of the melting vessel in addition to the cover heater. In this manner, an even better axial heat flow or temperature gradient can be obtained between the cover heater and the bottom heater, a heat flow that can be adjusted with unusual sensitivity.

Advantageously, the bottom heater is disposed below the bottom of the melting vessel in a manner such that said heater does not include the seed crystal well or is at least disposed at a distance opposite said well in insulating fashion to prevent undesirable premature melting of the seed crystal.

In a preferred embodiment of the invention, all heating elements are enclosed in a jacket of insulating material surrounding the melting vessel, thus preventing an undesirable or uncontrolled heat flow.

It was found advantageous to provide one or more temperature-measuring elements disposed, if possible, closely adjacent to the outer wall of the melting vessel. Preferably, the measuring element(s) is (are) in the form of a sliding element(s) which during the operation of the system is (are) slidably disposed along the side wall to ensure measurement of the temperature gradient extending axially from the bottom of the vessel to the vessel cover. Preferred measuring elements are thermocouples, thermistors and particularly pyrometers.

In a particularly preferred embodiment, the device of the invention is provided with an arrangement enabling the boundary between the solid crystalline phase and the melted liquid phase to be determined. A phase feeler has been found advantageous for this purpose, said feeler comprising a feeling rod contained in a hollow guide tube extending into the melting vessel. The rod in the guide tube can be slowly lowered to feel the solid phase. In another preferred embodiment, the phase feeler consists of an ultrasonic device which dips into the melt from above and measures the sound waves reflected from the phase boundary, indicating crystal growth in this manner.

In another embodiment of the invention, the device is provided with a condenser disposed above the opening of the melting crucible, said condenser eliminating material vapors that may be escaping. In another preferred embodiment, the housing of the device of the invention is provided with a cover that can be opened and closed thus allowing the crystal raw material to be charged to the melting vessel and the finished crystal to be removed therefrom. Preferably, the housing of the device has at least one opening for admitting air to and removing air from the entire inner space. Through this opening, the inside of the device can be placed under vacuum and/or optionally filled with a protective gas.

The elements of the device of the invention disposed inside the housing preferably consist of graphite, the melting vessel being made of highly heat-conducting, pressed graphite. The insulating material preferably consists of loosely packed graphite, particularly fibrous material made of graphite wool or graphite mats. The heating elements are also advantageously made of graphite. The heat-producing, electrically conductive graphite strips wind in meander-like fashion around the surface to be heated and generate heat as electric resistance heaters. To prevent short circuits, the current-conducting elements are kept at a distance from the neighboring graphite parts by means of insulators. Boron nitride insulators are preferred for this purpose.

The housing of the apparatus of the invention usually consists of a chemically and heat-resistant material, preferably an alloy steel, high-quality alloy steel being particularly preferred. In many cases, however, structural steel was found to be adequate.

The invention also relates to a method for producing large-volume monocrystals. According to the invention, said method comprises melting a crystal raw material mass in a vessel provided with a bottom, side walls, an upper opening and optionally a cover which at least partly closes the upper opening. In principle, it is also possible to introduce the already molten crystal raw material mass into the melting vessel.

According to the invention, to produce large-volume monocrystals, the melt is slowly cooled starting from the crucible bottom and in the direction of the melt surface or cover heater disposed above the melt surface. As a result, at the bottom of the vessel is formed a seed crystal which grows along the temperature gradient or along the heat flow axis. According to the invention, only a single heat flow or temperature gradient is formed between the bottom of the vessel and the melt surface. This means that, in the melting crucible, temperature surfaces facing each other are formed which are planar, the temperature increasing from the bottom of the crucible to the surface of the melt or cover heater, and the temperature being the same at all points within a temperature surface or temperature plane, namely not varying by more than 2° C. Preferably the increase in temperature between the bottom of the vessel and the surface of the melt is continuous. Should the surfaces wherein the temperature is constant exhibit a minimal curvature, the radius of this curvature is $\geq 1$ m, radii of $>2$ m and particularly of $>4$ m being especially preferred.

In this manner, a phase boundary is formed between the solid, crystalline and the liquid, molten phase, said boundary forming along the temperature profile, namely parallel to the planes of equal temperature, and growing perpendicularly to said planes.

The phase boundary needed for the crystal growing according to the invention is obtained by preventing the formation of a lateral, namely radial heat flow. This is achieved with the aid of lateral elements, particularly elements disposed around the walls of the melting vessel. Such elements preferably consist of a supporting heater and/or an insulating material. It is particularly preferred to dispose along, and at a distance from, the side walls heating elements which serve exclusively to maintain the temperature. In this case, the interspace between the melting vessel and the heater disposed at a distance therefrom is filled with insulating material which on the one hand prevents lateral heat removal and thus the formation of a radial temperature gradient and, on the other, keeps the supporting heater from causing local overheating in the melting vessel. In essence, the supporting heater serves to counteract any heat loss through the insulating jacket thus supporting the maintenance of radial planarity of the temperature profile.

In principle, it is possible to form the axial heat flow formed by the method of the invention by means of a cover heater disposed above the crucible. It is preferable, however, also to heat the bottom of the crucible by means of a bottom heater so as to form a temperature gradient between the cover heater and the bottom heater.

According to the invention, it is preferred to promote crystal growth with the aid of a seed crystal placed at the bottom of the melting vessel. The seed crystal is preferably a monocrystal which is introduced into a seed crystal well connected to the bottom of the vessel and preferably so that the orientation of said seed crystal corresponds to the desired later orientation of the large-volume monocrystal. The melting is then carried out by turning on the cover heater and preferably the bottom heater so that the crystal raw material present in the vessel is melted. Optionally, the jacket heater is also turned on to provide support. The crucible is thus preferably heated to a temperature at which possibly present water of crystallization is released first. Thereafter, the temperature is raised further to remove any dissolved gases or gaseous constituents retained in the crystal raw material mass, as well as any gaseous decomposition products formed during the heat-up.

The melt is then homogenized over a prolonged period, preferably for at least one day. In particular, this is achieved by adjusting the heat output of the heating elements so that convection is generated in the melt which is thus continuously mixed. As a result, dissolved and undesirable impurities reach the melt surface wherefrom highly volatile substances, in particular, can vaporize off. Any crystal material that may be entrained is collected by means of a, preferably cooled, condenser. The homogenization of the melt is preferably carried out for at least two days and particularly for at least five days, at least one week being especially preferred.

During the melting and the homogenization, the seed crystal present in the seed crystal well is preferably cooled to prevent premature incipient or complete melting. This is usually accomplished by means of water cooling. Advantageously, the cooling is accomplished by means of a water-cooled graphite rod.

At the end of the melting and homogenization of the melt, the seed crystal is carefully melted. This is normally done in that the cooling is reduced and/or a seed crystal well heater is inserted. The seed crystal is carefully melted from the top downward so that a uniform transition arises between the seed crystal and the melt. The axial temperature gradient is then formed either by slowly lowering the heat output of the cover heater and/or of the bottom heater. Preferably, however, the cover heater is set at a temperature which is the same as, or is above or preferably slightly above, the crystallization temperature of the crystal to be produced. Advantageous cover heater temperatures are 200–300° C. above the crystallization temperature. The temperature of the bottom heater is advantageously at least 650° C. and preferably at least 900° C., but during the growing of the crystal is lower than the melt temperature. The heat output of the bottom heater is then slowly reduced. By reducing the bottom heater to a temperature below the crystallization temperature, the melt slowly cools along the axial temperature gradient, and the phase boundary formed at the plane of the crystallization temperature is slowly displaced in the melting vessel from the top downward causing the crystal to grow. In principle, it is also possible to reduce the temperature of the cover heater. In this case, the temperature is reduced at a rate for which the crystal growth occurs at 0.01 to 5 mm/hour, preferably 0.1 to 1 mm/hour and particularly 0.2 to 0.5 mm/hour. These values are usually achieved using a cooling rate of 0.001 to 5° C. per hour.

It has been found advantageous if during the growing process the temperature in the crystallized phase, namely in the grown crystal, is not lower then a limiting temperature at which a plastic deformation of the crystal is still possible. For this reason, the axial temperature gradient behind the phase boundary should be as flat as possible.

According to the invention, it has been found advantageous to form in the lower, conical part of the bottom of the melting crucible, namely in the part forming the bottom between the seed crystal well and the wall of the crucible, a nonplanar phase boundary curved upward toward the cover and having a curvature radius of <1 m, preferably <0.8 m and particularly <0.5 m.

After the monocrystal has been produced in this manner, it is annealed. As a result, any crystal nonhomogeneities are removed at an elevated temperature, namely the crystal defects are repaired at this temperature. After the growing and annealing of the crystal, the entire large-volume monocrystal is slowly cooled to room temperature. Such cooling is usually carried out over several days to several weeks and, depending on the phase and stage, preferably at a cooling rate from about 0.001° C./hour to 15° C./hour, particularly to 10° C./hour and advantageously to 1° C./hour, with 0.01° C./hour to 8° C./hour and particularly 3° C./hour being preferred. For the cooling, too, an essentially axial temperature gradient is preferably retained. In this case, however, the lateral support heating may optionally be omitted. Such slow cooling affords large-volume crystals which are unusually free of stress. The cooling rate is preferably controlled by means of several temperature sensors disposed in the device of the invention. In this manner, the temperature course during cooling can also be controlled. As for crystal growing, this is advantageously done with the aid of a computer.

The crystal raw material used for the method of the invention comprises, in particular, raw materials containing in addition to the crystal material also scavengers which during a homogenization phase react with possibly present impurities to form readily volatile substances. Preferred crystal materials are $MgF_2$, $BaF_2$, $SrF_2$, LiF and NaF, with $CaF_2$ being particularly preferred. The method of the invention affords large-volume monocrystals with a diameter of at least 200 mm, preferably at least 250 mm and particularly at least 300 mm and with a height of at least 100 mm, preferably 130 mm and particularly at least 140 mm. The optical homogeneity attained throughout the entire crystal volume is unusually high, meaning that the maximum refractive index variation throughout the crystal volume corresponds to a maximum difference $\Delta n$ of $\leq 3 \times 10^{-6}$, preferably $>2 \times 10^{-6}$ and particularly $>1 \times 10^{-6}$, the stress birefringence SBR being <3 nm/cm and particularly <2 nm/cm and especially <1 nm/cm.

The method of the invention is preferably carried out in a vacuum between $10^{-3}$ and $10^{-6}$ mbar (corresponding to $10^{-1}$ to $10^{-4}$ Pa) and preferably between $10^{-4}$ and $10^{-5}$ mbar ($10^{-2}$ to $10^{-3}$ Pa). It is particularly preferred to carry out the method of the invention in an atmosphere of protective gas, particularly in a nonoxidizing atmosphere. To this end, the entire apparatus of the invention is flushed before or also during the heating with inert gas or an inert gas mixture.

In carrying out the method of the invention, the device of the invention is preferably mounted in shock-free fashion. During operation, the melting vessel and the heating elements are firmly mounted in an unchangeable, relationship to each other.

The large-volume crystals obtained by the method of the invention are particularly well suited for the production of optical components for DUV lithography and for the production of wafers covered with photoresist and thus for the production of electronic devices. Hence, the invention also relates to the use of monocrystals made by the method of the invention and/or in the device of the invention for the production of lenses, prisms, light-conducting rods, optical windows and optical devices for DUV lithography and particularly for the production of steppers and excimer lasers and thus also for the production of integrated circuits and electronic devices such as computers containing computer chips as well as for other electronic devices containing chip-like integrated circuits.

BRIEF DESCRIPTION OF THE DRAWING

The invention will now be explained in greater detail by way of the following figures and example.

DETAILED DESCRIPTION OF THE INVENTION

Figure 1:
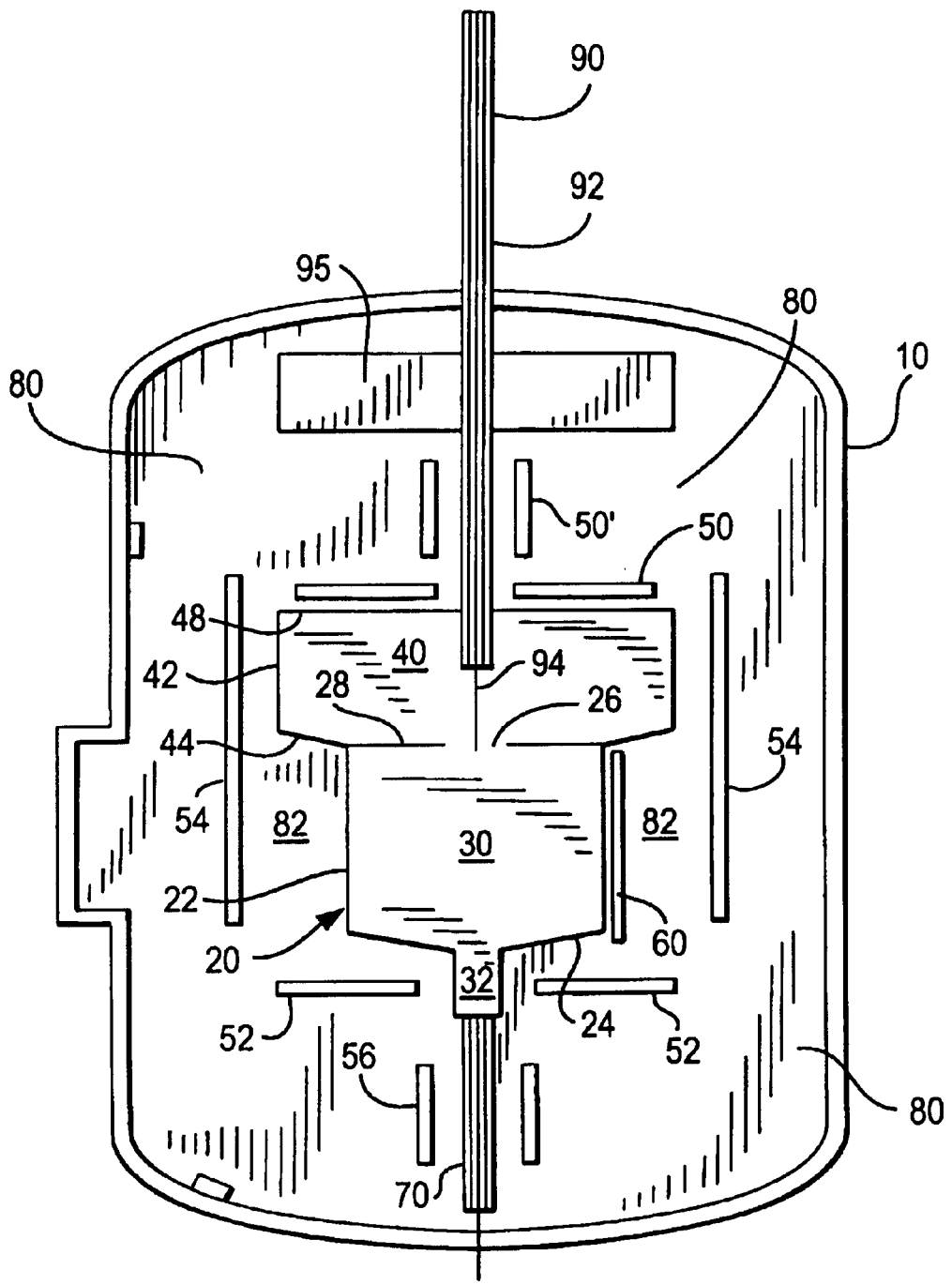
FIG. 1 is a schematic cross-sectional view through a device of the invention for growing large-volume crystals.

As shown in FIG. 1, the device of the invention comprises a special double-wall housing 10 wherein is disposed melting crucible 20 made of pressed graphite, which acts as the melting vessel. Melting crucible 20 has an inner space 30 (melting and crystallization space) defined by walls 22, a conical bottom 24 shaped like a truncated cone and by an upper crucible opening 26 which is partly closed by a cover 28. The bottom 24 is provided with a downwardly extending seed crystal well 32 for a seed crystal. A funnel-shaped buffer chamber 40 made of the same material as melting crucible 20 is arranged above the melting crucible 20 and connected to it, preferably so as to form a single piece. Buffer chamber 40 also has side walls 42, a cover 48 and a bottom 44 which is connected with side walls 22 of melting crucible 20. A cover heater 50, 50' is arranged above buffet chamber 40 and is located opposite from a bottom heater 52. Bottom heater 52 is disposed to the side of the seed crystal well 32 and is kept at a distance therefrom to prevent the premature melting of the seed crystal contained therein. The seed crystal well has a water-cooled graphite rod 70 at its bottom. Lateral heating elements 56 for the intentional melting of the seed crystal are arranged laterally to the water-cooled graphite rod 70 and the seed crystal well 32. Moreover, laterally to melting crucible 20 is disposed a temperature-measuring element 60 configured as a sliding element, whereby the axial temperature course can be accurately determined. Side walls 22 of vessel 20 are completely surrounded by insulating jacket 82. Insulating jacket 82 is located at a distance from a lateral, jacket-like supporting heater 54. Heating elements 50, 50', 52, 54 and 56 and melting crucible 20 with seed crystal well 32 and the buffer chamber 40 disposed above it are surrounded by an insulating material 80 consisting of graphite which prevents lateral heat flow and only permits the formation of an axial temperature gradient between the cover heater 50, 50' and melting crucible bottom 24 or bottom heater 52.

The device of the invention also has an opening, not shown, for flushing with an inert gas or for applying vacuum. To determine the size of the growing crystal or the position of the phase boundary, there is provided a phase feeler or detector 90 which extends from the outside through the housing and contains rod 94 slidably disposed in outer tube 92. This rod 94 is capable of being slowly moved downward and of feeling or detecting the solid phase boundary. In principle, tube 92 can also be connected with rod 94. To separate the impurities removed during homogenization, condenser 95 is disposed above the melting crucible.

EXAMPLE 1

Figure 2:
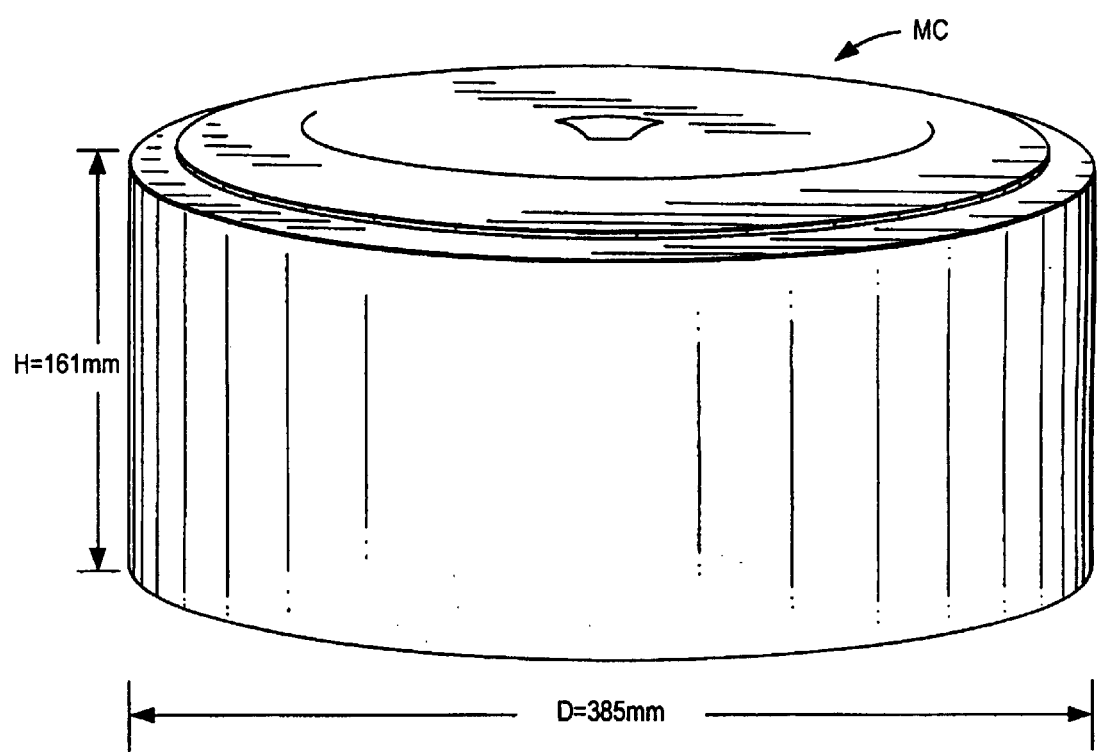
FIG. 2 is a perspective view of a monocrystal produced with this device and having a diameter of 385 mm and a height of about 160 mm.

To produce a calcium fluoride monocrystal, inner space 30 of melting vessel 20 was filled with a calcium fluoride mixture, which in addition contained scavenger materials with high affinity for oxygen, such as $PbF_2$, $SnF_2$ or $CdF_2$. The device was then closed with a cover not shown in FIG. 1 and was flushed with nitrogen as inert gas to remove the undesirable atmospheric oxygen. A vacuum of $10^{-4}$ mbar ($10^{-2}$ Pa) was then applied and, while cooling the seed crystal well 32, cover heater 50, 50', bottom heater 52 and optionally jacket heater 54 were put in place and slowly heated to 1450° C. over a period of several hours. The melt was then homogenized at this temperature for five days while maintaining convection in it. After the homogenization, the bottom heater temperature was reduced to a temperature of 1200° C., and the seed crystal was carefully melted with the aid of seed crystal well heater 56. After turning off the seed crystal well heater, cover heater 50, 50' was kept constant while the bottom heater 52 was made to cool slowly, over a period of several days, to a temperature below the crystallization point, causing a monocrystal to grow from the seed crystal in the direction of the melt surface. The resulting monocrystal had the same orientation as the seed crystal. After the entire melt had solidified with formation of a monocrystal, the resulting monocrystal was annealed and cooled to room temperature over a period of three weeks. In this manner, a monocrystal MC was obtained as shown in FIG. 2, which had a diameter, D, of 385 mm and a height, H, of 161 mm (without seed crystal well portion). The monocrystal had throughout the entire crystal volume a refractive index variation $\Delta n < 1 \times 10^{-6}$. The stress birefringence SBR was <1 nm/cm. Moreover, the crystal thus obtained had an unusually high radiation resistance.

Figure 3:
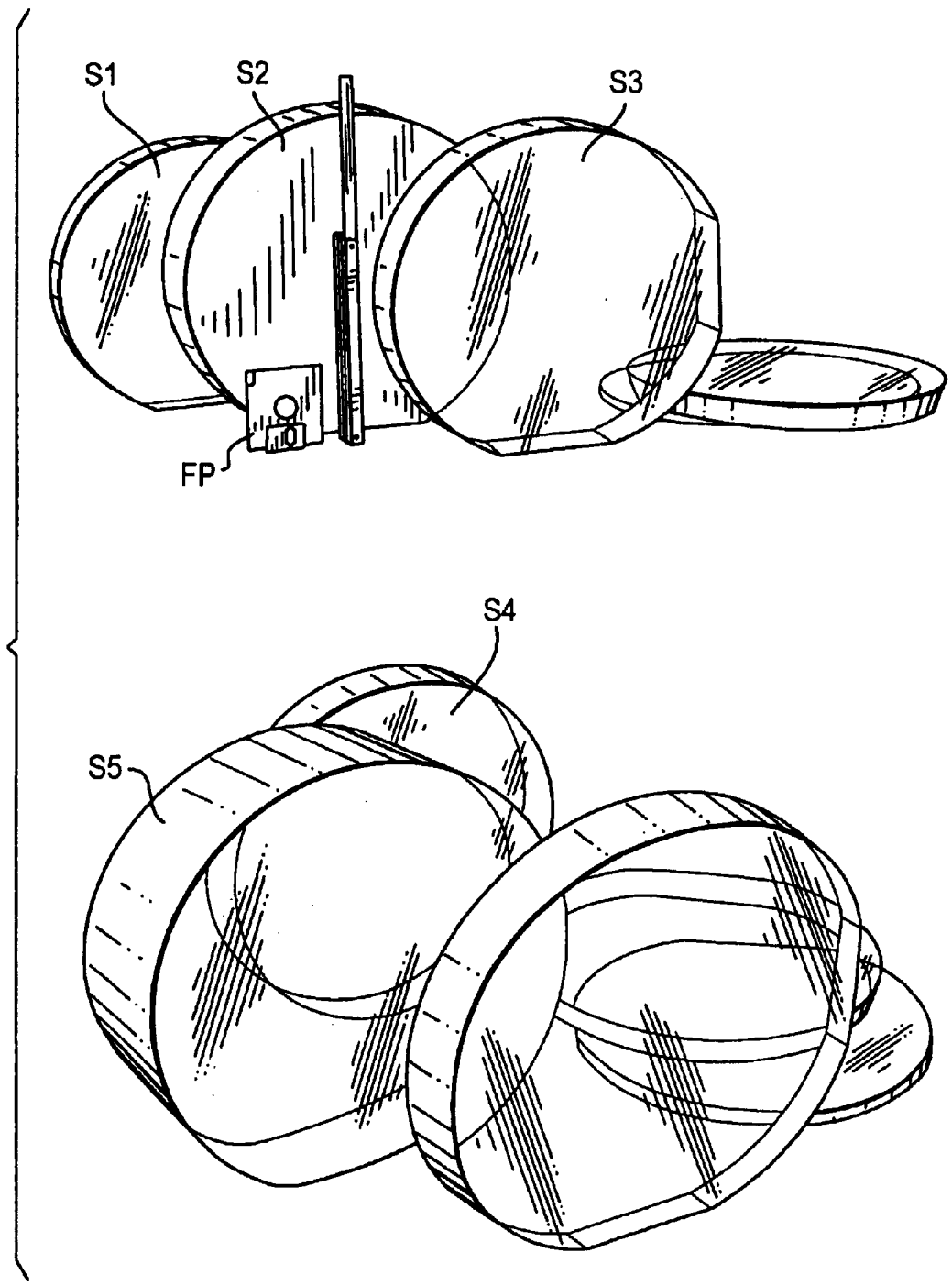
FIG. 3 is a perspective view of monocrystal slices obtained from the monocrystal of FIG. 2.

Monocrystal slices S1, S2, S3, etc, from the monocrystal MC are shown in FIG. 3. A floppy disk FP is also shown in FIG. 3 to provide a feeling for the size of the monocrystal slices.

What is claimed is:

1. A large-volume monocrystal having a diameter of at least 300 mm and a height of at least 140 mm, a maximum refractive index variation through a crystal volume less than or equal to $2 \times 10^{-6}$ and a stress birefringence SBR than 2 nm/cm;
    wherein said large-volume monocrystal is made by a method comprising the steps of:
    a) providing a device comprising a housing (10) with a closable charging and discharging opening, a melting vessel (20) disposed in said housing (10) and enclosing a melting space (30), said melting space (30) being bounded by a bottom (24), side walls (22), an upper opening (26) opposite the bottom and optionally by a cover (28) for said upper opening, at least one heating element (50, 50') for melting a crystal raw material mass placed in the melting space (30) and/or for maintaining a molten state of an already melted crystal raw material mass, said at least one heating element (50, 50') being disposed above said melting vessel (20) and generating an axial heat flow extending axially between the bottom (24) and the opening (26) of the melting vessel, and at least one element (82, 54) disposed at the side walls (22) of the melting vessel (20) so as to prevent a lateral heat flow;
    b) heating crystal raw material present in said melting vessel (20) by said at least one heating element (50, 50') or introducing already melted crystal raw material at a temperature above a melting point of the crystal raw material to form a melt with a melt surface in the melting vessel;
    c) subsequently lowering the temperature to at least a crystallization point of the crystal raw material so as to form said monocrystal on the bottom (24) of the melting vessel (20), said monocrystal forming a solid/liquid phase boundary at which said monocrystal grows toward the melt surface in a direction perpendicular to said phase boundary; and
    d) maintaining a vertical axial temperature gradient between the bottom (24) of the melting vessel (20) and the upper opening (26) and preventing heat inflow and/or heat outflow through said side walls (22) by means of the at least one element (82, 54), so that said solid/liquid phase boundary has a curvature radius of at least one meter.

2. The large volume monocrystal as defined in claim 1, wherein said maximum refractive index variation through the crystal volume is less than or equal to $1 \times 10^{-6}$ and said stress birefringence SBR is less than 1 nm/cm.

3. The large volume monocrystal as defined in claim 1, wherein said crystal raw material is a metal fluoride selected from the group consisting of calcium fluoride, magnesium fluoride, barium fluoride, strontium fluoride, lithium fluoride and sodium fluoride.

4. A method for growing a large-volume monocrystal with a uniform orientation from a melt of crystal starting material, said method comprising the steps of:
    a) providing a device for growing the large-volume monocrystal comprising a housing (10) with a closable charging and discharging opening, a melting vessel (20) disposed in said housing (10) and enclosing a melting space (30), said melting space (30) being bounded by a bottom (24), side walls (22), an upper opening (26) opposite the bottom and optionally by a cover (28) for said upper opening, at least one heating element (50, 50') for melting a crystal raw material mass placed in the melting space (30) and/or for maintaining a molten state of an already melted crystal raw material mass, said at least one heating element (50, 50') being disposed above said melting vessel (20) and generating an axial heat flow extending axially between the bottom (24) and the opening (26) of the melting vessel, and at least one element (82, 54) disposed at the side walls (22) of the melting vessel (20) so as to prevent a lateral heat flow;
    b) heating crystal raw material present in said melting vessel (20) by said at least one heating element (50, 50')

or introducing already melted crystal raw material at a temperature above a melting point of the crystal raw material to form a melt with a melt surface in the melting vessel;

c) subsequently lowering the temperature to at least a crystallization point of the crystal raw material so as to form said monocrystal on the bottom (24) of the melting vessel (20), said monocrystal forming a solid/liquid phase boundary at which said monocrystal grows toward the melt surface in a direction perpendicular to said phase boundary; and d) maintaining a vertical axial temperature gradient between the bottom (24) of the melting vessel (20) and the upper opening (26) and preventing heat inflow and/or heat outflow through said side walls (22) by means of the at least one element (82, 54), so that said solid/liquid phase boundary has a curvature radius of at least one meter.

5. The method as defined in claim 4, wherein said direction of growth of the monocrystal is set in advance by means of a seed crystal.

6. The method as defined in claim 4, wherein said direction of growth of the monocrystal corresponds to a {111} or {112} crystal axis.

7. The method as defined in claim 4, wherein said vertical axial temperature gradient is maintained by means of a bottom heater (52) arranged below said bottom (24) of said melting vessel (20) and a cover heater (50) arranged above said upper opening (26).

8. The method as defined in claim 7, wherein a crystal growth rate of 0.1 to 1 mm/hr is produced by slowly reducing an amount of heat produced by the bottom heater (52).

9. The method as defined in claim 7, wherein said bottom heater (52) is maintained at a temperature, which is at the most 10° C. below the melting point of the crystal raw material.

10. The method as defined in claim 4, further comprising cooling said melt and/or said monocrystal at a cooling rate of 0.1 to 5° C. per day.

11. The method an defined in claim 4, further comprising, after introducing said crystal raw material into said melting vessel (20), flushing said device including a remaining portion of the melting vessel (20) with an inert gas and/or growing said monocrystal under vacuum.

12. The method as defined in claim 4, wherein said crystal raw material is calcium fluoride.

13. The method as defined in claim 4, further comprising adding one or more scavengers to said crystal raw material.

14. The method as defined in claim 4, wherein said lateral heat flow is prevented by means of a supporting heater (54) kept at a distance from the melt vessel walls by means of a heat insulator (82).

15. The method as defined in claim 4, further comprising heating the bottom heater (61) to a temperature of at least 650° C. and the cover heater to a temperature of at least 1590° C. at a beginning of monocrystal growth.

16. The method as defined in claim 4, further comprising homogenizing said melt over a time period of 1 to 20 days prior to a start of monocrystal growth.

17. The method as defined in claim 7, further comprising maintaining said cover heater at a constant temperature while said bottom heater (52) is slowly cooled.

18. A device for growing a large-volume monocrystal, said device comprising a housing (10) with a closable charging and discharging opening;

a melting vessel (20) disposed in said housing (10) and enclosing a melting space (30), said melting space (30) being defined by side walls (22), a bottom (24), an upper opening (26) opposite the bottom and an optional cover (28) for said upper opening;

at least one heating element (50, 50') for melting a crystal raw material mass placed in the melting space (30) and/or for maintaining a molten state of an already melted crystal raw material mass, said at least one heating element (50, 50') being disposed above said melting vessel (20) and generating an axial heat flow extending axially between the bottom (24) and the opening (26) of the melting vessel; and at least one element (82, 54) disposed at the side walls (22) of the melting vessel (20) so as to prevent a lateral heat flow.

19. The device as define in claim 18, wherein said at least one element (82, 54) disposed at the side walls (22) prevents formation of said lateral heat flow to a sufficient extent so that during crystal growth a planar solid/liquid phase boundary with a curvature radius of $\geq 1$ m is formed.

20. The device as defined in claim 18, wherein said bottom (24) of the melting vessel (20) has a conical shape.

21. The device as defined in claim 18, wherein said bottom (24) of the melting vessel (20) is provided with a seed crystal well (32) for receiving a seed crystal.

22. The device as defined in claim 21, further comprising a cooling element (70) disposed at said seed crystal well (32).

23. The device as defined in claim 18, further comprising a temperature-measuring element (60) is provided at the side wall (22) of the melting vessel (20).

24. The device as defined in claim 19, further comprising an element (90) for detecting said solid/liquid phase boundary.

25. The device as defined in claim 18, wherein said heating elements, the at least one element for preventing lateral heat flow and/or said melting vessel are made of graphite.

26. The device as defined in claim 18, wherein said at least one element (82, 54) comprises a supporting heater (54) spaced a distance from the side walls (22) of the melting vessel.

27. The device as defined in claim 18, further comprising a bottom heater (52) arranged below said bottom (24) of said melting vessel (20), said bottom heater comprising means for maintaining a vertical axial temperature gradient in said melt.

* * * * *